United States Patent [19]

Abramovich et al.

[11] Patent Number: 4,978,220

[45] Date of Patent: Dec. 18, 1990

[54] COMPENSATING SYSTEM FOR INSPECTING POTENTIALLY WARPED PRINTED CIRCUIT BOARDS

[75] Inventors: Abe Abramovich, Lawrenceville; Gordon I. Robertson, Pennington, both of N.J.

[73] Assignee: Cimflex Teknowledge Corporation, Princeton, N.J.

[21] Appl. No.: 198,156

[22] Filed: May 24, 1988

Related U.S. Application Data

[63] Continuation-in-part of Ser. No. 164,226, Mar. 4, 1988, abandoned.

[51] Int. Cl.⁵ .................... G02B 7/11; H01L 21/66
[52] U.S. Cl. .................................. 356/394; 358/101
[58] Field of Search .................. 356/394; 358/101; 250/201 AF, 201.4; 354/401

[56] References Cited

U.S. PATENT DOCUMENTS 4,230,940 10/1980 Minami et al. ............... 250/201 AF
4,331,409 5/1982 Cianci et al. ........................ 354/401

FOREIGN PATENT DOCUMENTS 3308191 9/1983 Fed. Rep. of Germany ...... 356/394

Primary Examiner—Richard A. Rosenberger
Attorney, Agent, or Firm—Weiser & Stapler

[57] ABSTRACT

A compensating system for insepcting potentially warped printed circuit boards provides the insepction head of a printed circuit board inspection apparatus with a compensating device which is capable of detecting deviations in the printed circuit board which depart from a reference standard, for use in accurately compensating for such deviations during the board inspection procedure. An appropriate source (including ultrasonic, laser and directed light sources) is used to direct emissions toward the surface of a printed circuit board to be inspected. Detected reflections are then used to provide information useful in determining deviations of the surface of the printed circuit board from the reference standard, to adjust the anticipated locations for any component features, connecting leads or pins which are to be inspected within the subject viewing field.

35 Claims, 2 Drawing Sheets

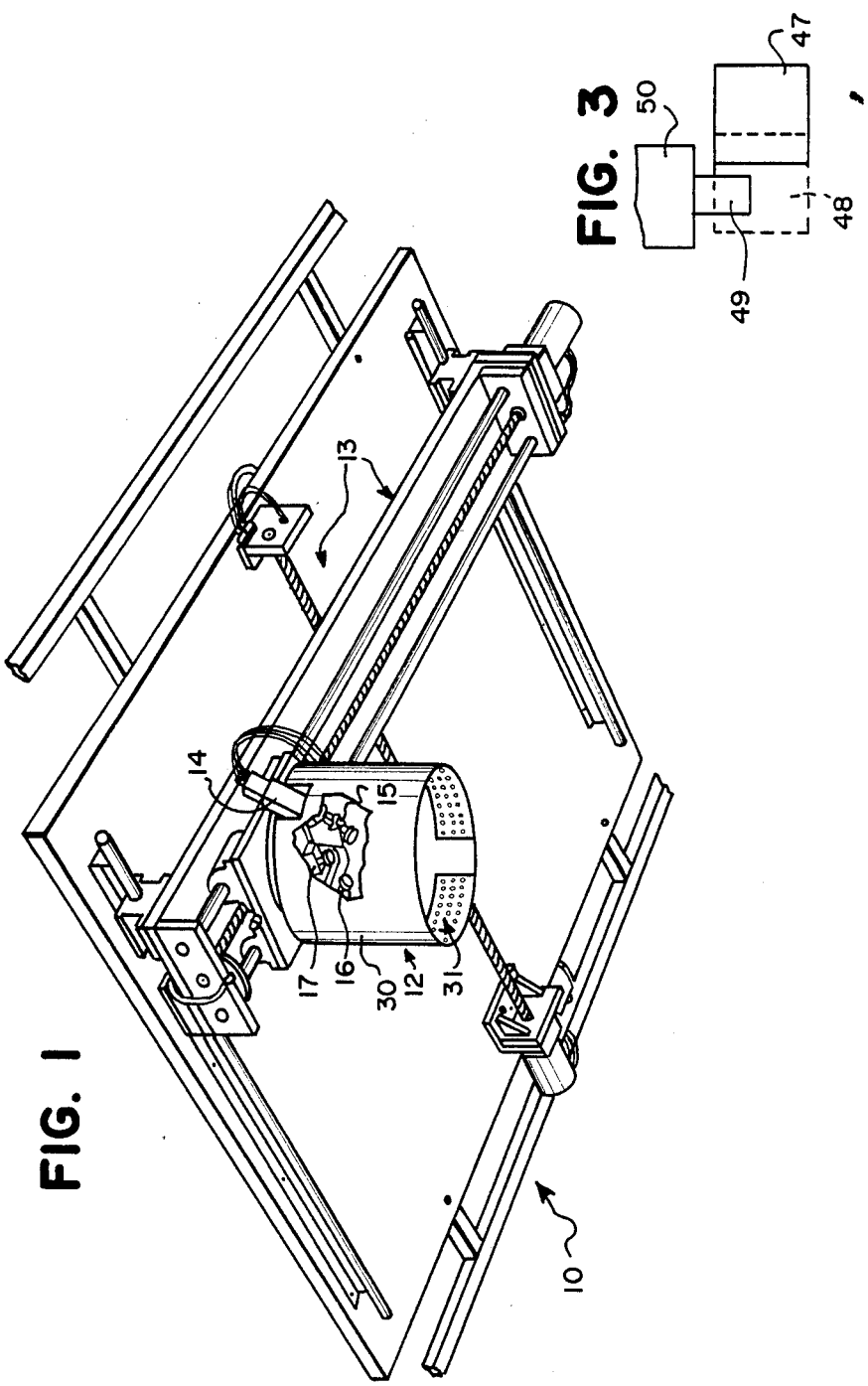

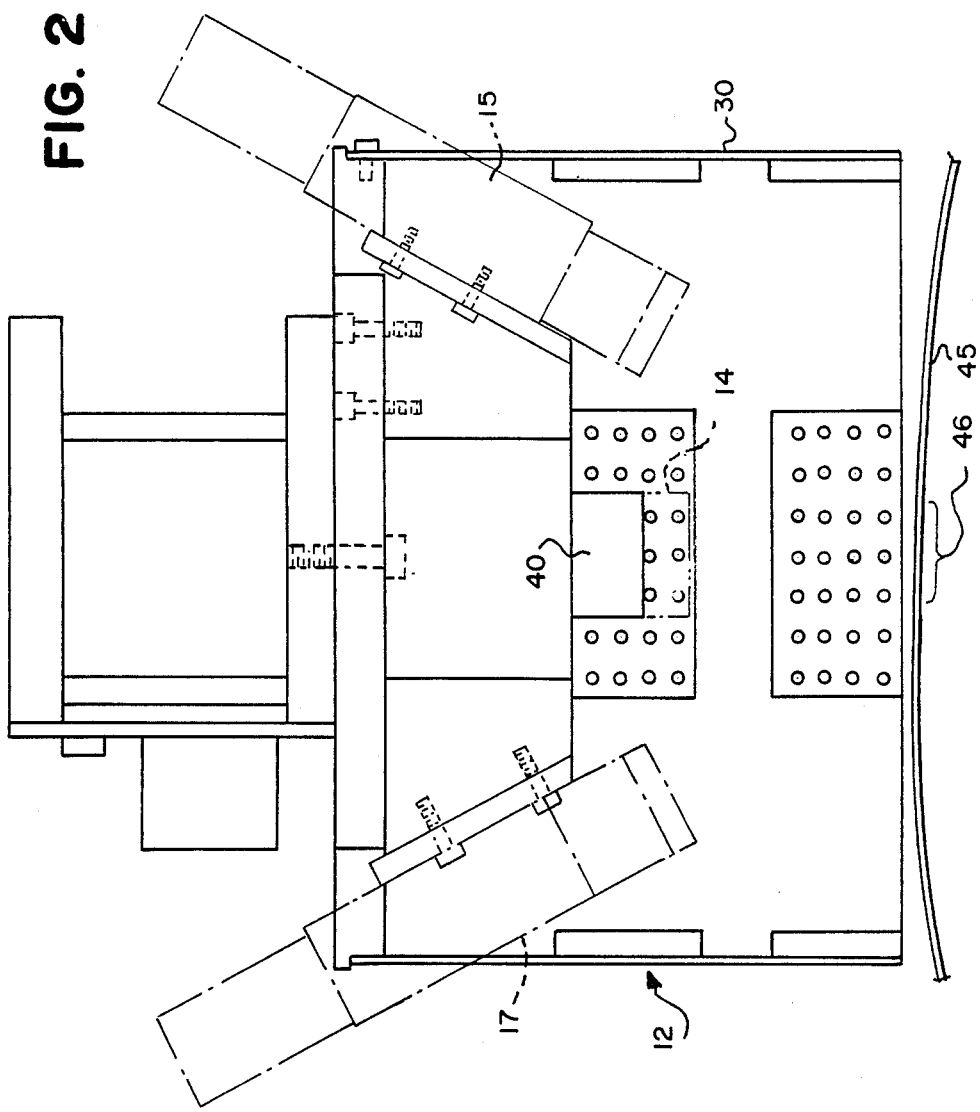

COMPENSATING SYSTEM FOR INSPECTING POTENTIALLY WARPED PRINTED CIRCUIT BOARDS

Related Case

This is a continuation-in-part of prior co-pending U.S. patent application Ser. No. 164,226, filed Mar. 4, 1988 now abandoned, the subject matter of which is incorporated by reference herein.

BACKGROUND OF THE INVENTION

This invention relates generally to a system for inspecting printed circuit boards, and more particularly, to a system for inspecting printed circuit boards which may be warped to varying extent to accurately verify correct component placement and proper solder connections.

As is known to persons skilled in the art, a printed circuit board is used for mounting and electrically interconnecting electrical components in a predetermined manner Traditionally, this was accomplished using through-the-hole technology which involved the placement of components (both passive and active) on the top side of a printed circuit board so that the connecting leads or pins of the components extended through holes (generally plated) provided in the circuit board. The leads or pins extending through the circuit board were then bent over to mechanically clamp the electrical components to the printed circuit board, followed by an appropriate soldering operation to complete the necessary connections. More recently, this has been accomplished using surface mount technology (SMT) which involves the placement of components (both passive and active) on top of the printed circuit board so that their connecting leads communicate with conductive pads associated with the top face of the printed circuit board. The components are then electrically connected to their associated pads by an appropriate soldering operation, from the top of the board.

In either case, it has become traditional for such printed circuit boards to be constructed mechanically, using automated assembly machines which operate to reduce the often prohibitive costs of manually assembling a printed circuit board. While reducing overall costs, such automated assembly has been found to result in periodic mis-insertions (through-the-hole) or mis-placements (SMT) of the components, and their connecting leads or pins, resulting in an ineffective or unreliable electrical connection. Considering the costs which inherently result from such assembly errors, a variety of steps were taken to locate potential errors as early as possible in the assembly process This is because the cost of correcting an error increases significantly as the board proceeds through subsequent manufacturing, and distribution steps. For example, an assembly error which is found prior to soldering is inexpensively repaired, while an assembly error which is not found until final assembly (in a product) is often so costly to repair that the assembled board is often discarded rather than attempting to locate and correct the problem.

Early efforts to locate such assembly errors involved a visual inspection of each printed circuit board at a desired stage of the manufacturing process, by human operators using the naked eye, or possibly a stereo microscope or the like. However, since it is not uncommon for a typical printed circuit board to have from 1,000 to 10,000 leads or pins for connection, such a job was found to be extremely tedious and inaccurate. Accordingly, even under the best of conditions, a significant number of missed assembly errors was found to result. Added to this were the increased costs of such an inspection process due to the significant amount of time which was required, and the correspondingly increased inventories which were necessary to accommodate such visual inspections.

For this reason, steps were taken to develop automated systems for inspecting printed circuit boards, to replace such visual inspections. Two such devices, which have found wide acceptance in the industry, are the Model 5511A and the Model 5512A Printed Circuit Board Inspection Systems which are distributed by the Universal Instruments Corporation of Binghamton, N.Y. These devices generally employ a series of cameras which are mounted within a fixture (an inspection head) adapted for movement upon an X-Y table to inspect various portions of a printed circuit board (either from its underside for a through-the-hole board or from its top for an SMT board) which is received by the X-Y table. The inspection head is sequentially advanced to successive viewing fields (typically 2"×2" for through-the-hole boards and 1"×1" for SMT boards) established along the surface of the printed circuit board to inspect (through microprocessor analysis) the exposed components, and their connecting leads or pins, to verify their effective placement based upon a comparison with pre-established norms for the particular printed circuit board which is being tested Any defects are then reported to the operator, for appropriate correction.

The accuracy of this inspection is enhanced by providing an inspection head which incorporates a series of four angled, orthogonally placed cameras, each of which is provided with its own corresponding light source (preferably a series of controllable LED's). Such structure is provided to enable each of the series of viewing fields defined along the surface of a printed circuit board to be inspected from four different perspectives, making sure that each component feature, connecting lead or pin is detected in at least one of these four orientations. Through microprocessor controls associated with the apparatus, each of a series of anticipated components and their connecting leads or pins can be checked for proper placement in a highly reliable and automated fashion, eliminating the need for tedious visual inspections and the like.

However, it was found that the same angled camera placement which led to an enhanced accuracy of the inspection procedure also led to certain complications in cases where the printed circuit boards being inspected were warped to some extent. At the center of this problem was that the successive viewing fields of a warped printed circuit board will tend to be positioned differently relative to the inspection head and the series of cameras which it contains, which in turn tends to cause an apparent lateral shift between the viewed (by the cameras) position of a particular component and its connecting leads or pins, and the location of an associated inspection region which has been established for that component feature, connecting lead or pin based upon certain pre-established norms for the printed circuit board which is being inspected (i.e., a parallax). What is more, the degree of this lateral shifting tended to vary from one viewing field to another, depending upon the local curvature of the printed circuit board and the resulting distance between a particular viewing field of the printed circuit board and the series of cameras associated with the inspection head.

For this reason, it became necessary to compensate for the potentially adverse affects of a warped printed circuit board on the board inspection procedure. This was accomplished by preceding the inspection of a particular viewing field with a searching procedure in which a small number of selected (empirically selected) component features, connecting leads or pins were actively searched for and located, followed by a comparison with their anticipated placements. Any resulting deviations (resulting from the curvature of a warped board) were then used to correspondingly alter the anticipated locations of any inspection regions associated with the viewing field being inspected, to effectively realign the affected inspection regions for use in connection with the inspection procedure which was to follow.

While providing adequate compensation for warped printed circuit boards in many cases, certain difficulties were experienced. For example, if one of the selected component features, connecting leads or pins was not placed on the printed circuit board (an assembly error), or was not correctly located on the printed circuit board (an alignment error), an erroneous compensation could result which would render the subsequent inspection procedure ineffective. It was also possible to mistake an adjacent feature (particularly on a densely populated board) for the feature which was being searched for, again leading to an erroneous compensation and an ineffective inspection procedure.

It therefore became desirable to develop a system for more accurately inspecting potentially warped printed circuit boards, by more accurately compensating for apparent lateral shifting of the viewed image resulting from the curvature of a warped printed circuit board.

SUMMARY OF THE INVENTION

It is therefore the primary object of the present invention to provide a system for inspecting potentially warped printed circuit boards, which is capable of compensating for resulting board curvatures.

It is also an object of the present invention to provide a compensating system for inspecting potentially warped printed circuit boards which is capable of accurately compensating for board curvatures which may vary along the surface of the board which is being inspected, and from board to board.

It is also an object of the present invention to provide a compensating system for inspecting potentially warped printed circuit boards which is particularly suited to the enhanced printed circuit board inspection head of a Model 5511A or a Model 5512A Printed Circuit Board Inspection System, incorporating a series of four angled, orthogonally placed cameras.

It is also an object of the present invention to provide a compensating system of inspecting potentially warped printed circuit boards which is capable of providing the foregoing capabilities, yet which is simple in construction and use, and which does not materially affect the remainder of the circuit board inspection process.

These and other objects are achieved in accordance with the present invention by providing the inspection head of the printed circuit board inspection apparatus with a compensating device which is capable of detecting deviations in the printed circuit board which depart from a reference (essentially planar) standard, for use in accurately compensating for such deviations during the board inspection procedure. To this end, an appropriate source (including ultrasonic, laser and directed light sources) is centrally (and preferably axially) located within the inspection head to direct emissions toward the surface of a printed circuit board to be inspected. Detected reflections are then used to provide information useful in determining deviations of the surface of the printed circuit board from the reference standard in a particular viewing field This detected deviation is then used to adjust (computationally) the anticipated inspection regions for any component features, connecting leads or pins which are to be inspected within the subject viewing field, in place of the preliminary searching procedure which was previously used to perform this function The desired inspection procedure is then performed, making use of this adjusted data to provide an accurate means for locating desired component features and connecting leads or pins irrespective of any warping associated with the printed circuit board which is being inspected.

For further detail regarding a system having the foregoing capabilities, reference is made to the detailed description which is provided below, taken in conjunction with the following illustrations.

BRIEF DESCRIPTION OF THE DRAWINGS

FIG. 1 is a perspective view of an apparatus for inspecting SMT printed circuit boards which incorporates a compensating system in accordance with the present invention.

FIG. 2 is a partial side elevational view of the inspection head of the apparatus of FIG. 1, with portions broken away to reveal internal construction detail.

FIG. 3 is a schematic illustration of an inspection of a component feature on a printed circuit board using the compensating system of the present invention.

In the several views provided, like reference numerals denote similar structure.

DETAILED DESCRIPTION OF THE PREFERRED EMBODIMENT

FIG. 1 shows an apparatus 10 for inspecting printed circuit boards in accordance with the present invention. The apparatus 10 generally includes an inspection head 12 which is supported for predetermined movement in a defined plane by an X-Y table which is generally designated as 13, using any of a variety of servo-motor controls which are in themselves known to a person of ordinary skill in this art.

The apparatus 10 selected for illustration in the drawings corresponds to that of a Model 5512A Printed Circuit Board Inspection System, which is used to inspect SMT printed circuit boards from their top. Accordingly, the inspection head 12 and the associated X-Y table 13 are mounted in an inverted orientation so that the inspection head 12 is caused to travel across the top of a printed circuit board bearing SMT components, to permit an inspection from above. Further detail regarding such a system may be had with reference to U.S. patent application Ser. No. 159,774, which was filed on Feb. 24, 1988 and which is entitled "Apparatus for Inspecting Printed Circuit Boards with Surface Mounted Components", the subject matter of which is incorporated by reference as if fully set forth herein However, the improvements of the present invention are equally useful in connection with a Model 5511A Printed Circuit Board Inspection System to inspect through-the-hole printed circuit boards from the bottom, if desired. Further detail regarding such a system may be had with reference to U.S patent application Ser. No. 06/735,859, which was filed on May 20, 1985 and which is entitled "Processes And Apparatus For Inspecting Printed Circuit Boards", the subject matter of which is also incorporated by reference as if fully set forth herein However, by way of general description, and referring to FIGS. 1 and 2 of the drawings, it is seen that the inspection head 12 generally contains both a plurality of TV or video cameras 14, 15, 16, 17, and two series of lighting groups (only some of which are shown in the drawings). The cameras and the lighting groups are all contained within a hollow cylinder 30 which is used to house these components in a light-controlled (although not necessarily a light-tight) environment.

It will be noted that the cameras 14, 15, 16, 17 are arranged conically and disposed off of the vertical axis, projecting downwardly toward an open bottom 31 in the cylinder 30. Such positioning is preferred due to the discovery that this orientation enhances the probability of capturing reflected light from structure on the printed circuit board, while minimizing undesirable reflections (back-scattered signals) from the printed circuit board itself. The angle at which the cameras are caused to deviate from the vertical axis of the inspection head 12 may lie in a range of from 30° to 45° degrees, with an angle of 30° degrees being particularly preferred in this regard.

Such positioning causes the axes of the cameras to converge at the base of the cylinder 30, within successive "viewing fields" which are developed as the inspection head 12 is caused to proceed along the surface of the printed circuit board. The inspection head 12 is then caused to proceed between successive viewing fields to make determinations regarding the status of each component on the printed circuit board, its alignment with associated copper pads of the printed circuit board, and the integrity of any solder connections which have been made.

In general, these inspections are performed by defining a plurality of "windows" within each viewing field to be inspected which correspond to the anticipated placement of desired features, as well as any associated connecting leads or pins. The inspection procedure is then accomplished by sequentially accessing each of the cameras 14, 15, 16, 17 to acquire the image which is then being produced, and to then convert the acquired image to a digital signal (using techniques which are themselves known to persons of ordinary skill in this art) for further processing. Comparisons are then made to determine whether a detected component feature, connecting lead or pin is effectively placed and properly positioned by determining whether detected reflections (associated with these component features and associated leads or pins) are located within their anticipated windows. If not, appropriate steps are taken to advise an operator of the apparatus 10 of detected defects It is therefore important for there to be proper correlation between the component feature, connecting lead or pin which is being monitored and the anticipated window which is established for each monitored item. However, due to the angled placement of the cameras 14, 15, 16, 17, this cannot be assured when a warped board is being inspected by the apparatus 10. This is because different portions of a warped board will tend to exhibit a different orientation with respect to the cameras 14, 15, 16, 17, as the inspection head 12 is moved from viewing field to viewing field. This difference in orientation tends to cause an apparent lateral shift in the respective images which are acquired from the cameras 14, 15, 16, 17, which can cause a properly positioned component feature, connecting lead or pin to appear to lie outside of its anticipated window, or an incorrectly positioned component feature, connecting lead or pin to appear to lie within its anticipated window, in either case leading to an erroneous inspection.

In accordance with the present invention, this is corrected using a compensating unit 40 (see FIG. 2) which is positioned within the inspection head 12 of the apparatus 10. Although a variety of different placements for the compensating unit 40 are possible, an axial, centrally located positioning of the compensating unit 40 is generally preferred, as will become apparent from discussion to be provided below.

A variety of different components may be selected to serve the function of the compensating unit 40. For example, an ultrasonic transducer may be used for this purpose, if desired. One such ultrasonic transducer which has been found to provide a satisfactory result in this regard is the Ultra/Ranger 200 which is manufactured by the Xecutek Corporation. This device is selected as preferred because it conveniently incorporates both the transmitter and receiver, and the electronic circuitry which is needed to interpret resulting data, in a single package. Moreover, it has been found that the operating signals (50 kHz) which are produced by this unit are capable of resolving distances to one-thousandth of an inch (which is adequate for purposes of the present invention), and conveniently interface with the remainder of the printed circuit board inspection system with which it is used. However, other components may be substituted if desired.

Referring again to FIG. 2 of the drawings, ultrasonic emissions produced by the transmitter of the compensating unit 40 are directed downwardly toward the surface of a printed circuit board 45 (warping of the board 45 has been exaggerated for purposes of illustration) which is to be inspected, so that detected reflections may be used to measure the distance from the compensating unit 40 to the surface of the printed circuit board 45 within the viewing field 46. It has been found that an axial placement of the ultrasonic transducer is preferred because it tends to reduce the amount of calculations (and compensation steps) which are necessary to interpret the resulting data (which is received at the compensating unit 40) as will be described more fully below.

This measured distance is then compared with a pre-established reference distance from the compensating unit 40 to a "correctly configured" printed circuit board, to determine any deviation of the actual measured distance from this reference standard. Although this pre-established reference standard can be pre-defined, it is generally preferred to empirically define this reference by operating the system of the present invention in connection with a printed circuit board of known, correct construction. This is preferred because the reflection which will be received back from an assembled printed circuit board (bearing components) will be different from the reflection which would be received back from a planar surface, in essence producing an averaged measurement which depends upon the configuration of the printed circuit board and the components which are located within the subject viewing field (its topography). Since the circuit board 45 to be inspected should incorporate the same components, a more accurate comparison will then result since this averaging effect will be automatically compensated for. To be noted is that even if a component is missing from the printed circuit board to be inspected, an accurate measurement will still be made because discrete missing components will have a rather limited effect on the average result which is detected by the compensating unit 40 as previously described.

The compensating unit 40 is electrically coupled to the microprocessor (not shown) of the apparatus 10 which is used to perform the various inspections which are to be carried out. Within the microprocessor, the detected measurement is compared with the reference standard, to determine whether the distance to the printed circuit board 45 deviates from the reference standard in the viewing field 46 which is then being monitored. If so, this deviation is used to adjust the windows (e.g. the window 47 of FIG. 3) associated with the viewing field 46 by laterally shifting (in memory) the windows for that viewing field to a position (e.g. at 48 in FIG. 3) which compensates for warping of the printed circuit board 45 (in this case correctly "capturing" the lead 49 of the component 50 in a subsequent inspection procedure).

To be noted is that this adjustment procedure essentially corresponds to the adjustment procedure which was previously performed after seeking target component features and/or connecting leads or pins, which was the method previously employed by the apparatus 10 in an effort to compensate for warping of the printed circuit boards being inspected. Accordingly, only minimal changes to the apparatus 10 are required to provide a significantly enhanced compensation for warped printed circuit boards during the inspection process. The remainder of the inspection process then proceeds in conventional fashion, comparing acquired data with the adjusted windows established for the subject component features, connecting leads and pins.

As an alternative to the use of an ultrasonic transducer as previously described, laser ranging techniques are also available. One such device which has found to provide a satisfactory result in this regard is available from Candid Logic, Inc., of Madison Heights, Mich., under their model number SD120-R15, combined with an appropriate controller (either a fully packaged controller distributed under the model number MCU2 or a package-ready unit which is marketed under the model number MCU3). This device is selected as preferred because it has been found to be capable of locating the position of a printed circuit board with a sufficient degree of accuracy to achieve appropriate compensation in accordance with the present invention, and because it conveniently interfaces with the remainder of the printed circuit board inspection system with which it is used. However, other components may be substituted if desired.

Referring again to FIG. 2 of the drawings, coherent light produced by the compensating unit 40 is directed downwardly toward the surface of a printed circuit board 45 which is to be inspected, for interpretation by a receptor associated with the compensating unit 40 using light triangulation techniques (which are in themselves known to persons of ordinary skill in the art) to determine the location of the surface of the printed circuit board 45 within the viewing field 46, with respect to the compensating unit 40. Again, it has been found that an axial placement of the compensating unit 40 is preferred to provide an appropriate result.

In this regard, it will be appreciated that the location which is being sought is that of the surface of the printed circuit board 45, and not its included components (which may tend to vary). Although this location could be developed by operating upon a pre-selected region (an exposed portion of the circuit board), it has been found that this measurement can advantageously be accomplished during movement of the inspection head 12 from a previously inspected viewing field to the next viewing field to be inspected (saving processing time) by continuously monitoring the "location" of the circuit board 45 during this transfer and by then identifying the greatest monitored distance to the surface of the printed circuit board 45, which then represents the actual distance to the surface of the printed circuit board 45 (and not its included components).

In any event, this monitored location is then compared with a pre-established reference standard representing a "correctly configured" printed circuit board (again preferably empirically developed), to determine any deviation of the actual monitored location from this reference standard This deviation is then used, essentially in the same manner as previously described in connection with the ultrasonic transducer, to adjust the windows associated with the viewing field 46 by laterally shifting (in memory) the windows for that viewing field to a position which compensates for warping of the printed circuit board 45.

Yet another alternative means for implementing the compensating unit 40 makes use of an identifiable pattern which can be produced on the surface of the printed circuit board 45 by a structured light source. To this end, a light source is housed within the compensating unit 40, to expose an appropriately prepared slide provided at the base of the compensating unit 40. The slide is preferably formed of glass, having a chromium coating with a pattern etched in the coating to develop the identifiable pattern which is desired A lens is preferably used to focus the resulting image upon the surface of the printed circuit board 45.

The configuration of the etched pattern is capable of variation, as desired, but preferably takes the form of a square which, when projected upon the surface of the printed circuit board 45, is sized to compensate for any magnification resulting from the lens. It is generally preferred for the pattern which is developed to lie just outside of the viewing field which is to be inspected, to avoid potential interference with the inspection process itself. For example, in implementing such a structured light system in the previously referenced Model 5512A Printed Circuit Board Inspection System, it has been found that a viewing field in the form of a one-half inch square is often useful in providing the magnification which is needed for proper analysis In connection with this viewing field, it has been found that the use of a projected pattern which is square and which has a dimension of 0.6 inches on each side is sufficiently large to lie just outside of the viewing field under inspection, yet sufficiently small to lie within the capture range of the cameras 14, 15, 16, 17 of the inspection head 12 associated with the inspection apparatus 10 (which is used to monitor the identifiable pattern as will be described below) In connection with the above-discussed configuration of the Model 5512A Printed Circuit Board Inspection System, for example, this is accomplished by developing a square pattern on the glass slide having sides of a length of one-quarter inch and a thickness of 3 thousandths of an inch. Of course, other configurations could be implemented, if desired, either in connection with the previously described ½×½ inch viewing field, or the earlier described 1"×1" or 2"×2" viewing fields.

Referring again to FIG. 2 of the drawings, the identifiable pattern which results is directed downwardly toward the surface of a printed circuit board 45 which is to be inspected, to develop an identifiable pattern lying just outside of the viewing field 46. This then permits a preliminary analysis of this identifiable pattern, without interferring with other operations associated with the primary inspection procedure which is to take place. Again, it has been found that an axial placement of the compensating unit 40 is preferred to appropriately project the desired identifiable pattern upon the surface of the printed circuit board 45, for proper interpretation as follows.

Using techniques which are similar to those used to inspect other placements on the printed circuit board 45, steps are taken to sequentially access each of the series of cameras 14, 15, 16, 17 to detect reflections resulting from the identifiable pattern which has been projected upon the surface of the printed circuit board 45. The acquired data is then compared with preselected windows established (along exposed surface portions of the printed circuit board which do not include any components) to represent the anticipated placement of the identifiable pattern upon a substantially planar printed circuit board (i.e., a board which is not warped). Apparent horizontal deviations caused by vertical deviations of the (warped) printed circuit board are then capable of being detected, for appropriate compensation within the microprocessor which serves to inspect the printed circuit board 45, in the usual fashion.

It will therefore be understood that various changes in the details, materials and arrangement of parts which have herein been described and illustrated in order to explain the nature of this invention may be made by those skilled in the art within the principle and scope of the invention as expressed in the following claims.

What is claimed is:

1. In an apparatus for inspecting a printed circuit board having components affixed thereto, to determine if said components are properly placed and if connecting leads or pins associated with said components are properly positioned, and including means for detecting whether said components and said connecting leads or pins are positioned in a prescribed location, and means for compensating for variations in the detecting of components and connecting leads or pins on a warped printed circuit board, the improvement comprising:
    means for locating the position of a surface of said printed circuit board bearing said components and said connecting leads or pins;
    means for comparing said located position with a reference standard, to detect deviation between said located position and said reference standard; and
    means for adjusting said compensating means including means for altering said prescribed location according to said detected deviation.

2. The apparatus of claim 1 wherein said locating means is an ultrasonic transceiver.

3. The apparatus of claim 2 wherein said ultrasonic transceiver operates at about 50 kHz.

4. The apparatus of claim 2 wherein said distances are detectable to one-thousandth of an inch.

5. The apparatus of claim 2 wherein said locating means measures a distance from said ultrasonic transceiver to the surface of said printed circuit board.

6. The apparatus of claim 5 wherein said reference standard is a distance measured from said ultrasonic transceiver to the surface of a correctly assembled, generally planar printed circuit board.

7. The apparatus of claim 1 wherein said locating means is a laser ranging device.

8. The apparatus of claim 7 wherein said locating means locates a position of the surface of said printed circuit board with respect to said locating means.

9. The apparatus of claim 8 wherein said reference standard is a position of the surface of a correctly assembled, generally planar printed circuit board.

10. The apparatus of claim 1 wherein said inspecting apparatus includes an inspection head for inspecting said printed circuit board, and wherein said locating means is axially and centrally positioned within said inspection head.

11. The apparatus of claim 1 wherein said locating means is operated to separately adjust said inspection apparatus in each of a plurality of viewing fields associated with said printed circuit board, and which are to be inspected.

12. The apparatus of claim 1 wherein said inspecting apparatus includes means for defining at least one window for locating a component feature, connecting lead or pin, means for illuminating said printed circuit board, means for monitoring reflections from said printed circuit board, and means for determining whether said reflections are positioned within said window; and
    wherein said adjusting means alters said window according to the deviation detected by said comparing means.

13. The apparatus of claim 12 wherein said adjusting means alters said window according to the curvature of said printed circuit board.

14. The apparatus of claim 12 wherein said locating means comprises means for projecting an identifiable pattern of light onto the surface of said printed circuit board, and means for monitoring reflections of said identifiable pattern of light from said printed circuit board.

15. The apparatus of claim 14 wherein said projecting means is a light source projected through a slide bearing said identifiable pattern.

16. The apparatus of claim 15 wherein said identifiable pattern is a square positioned outside of a viewing field prescribed for said apparatus.

17. The apparatus of claim 16 wherein said viewing field is a one-half inch square, and wherein said identifiable pattern is a square measuring 0.6 inches on each side.

18. The apparatus of claim 14 wherein said monitoring means is an inspection head associated with said inspecting apparatus.

19. A method for inspecting a printed circuit board having components affixed thereto to determine if said components are properly placed and if connecting leads or pins associated with said components are properly positioned, in an apparatus including means for detecting whether said components and said connecting leads or pins are positioned in a prescribed location, and means for compensating for variations in the detecting of components and connecting leads or pins on a warped printed circuit board, comprising the steps of:
- providing means for locating the position of a surface of said printed circuit board bearing said components and said connecting leads or pins;
- locating the position of the surface of a printed circuit board to be inspected;
- comparing said located position with a reference standard, to detect a deviation between said located position and said reference standard; and
- adjusting said compensating means by altering said prescribed location according to said detected deviation.

20. The method of claim 19 wherein said locating means is an ultrasonic transceiver.

21. The method of claim 20 wherein said ultrasonic transceiver operates at about 50 kHz.

22. The method of claim 20 wherein said distances are detectable to one-thousandth of an inch.

23. The method of claim 20 wherein said locating includes measuring a distance from said ultrasonic transceiver to the surface of said printed circuit board.

24. The method of claim 23 wherein said reference standard is a distance measured from said ultrasonic transceiver to the surface of a correctly assembled, generally planar printed circuit board.

25. The method of claim 19 wherein said locating means is a laser ranging device.

26. The method of claim 25 wherein said locating includes locating a position of the surface of said printed circuit board with respect to said locating means.

27. The method of claim 26 wherein said reference standard is a position of the surface of a correctly assembled, generally planar printed circuit board.

28. The method of claim 19 wherein said inspecting apparatus includes an inspection head for inspecting said printed circuit board, and wherein said locating means is axially and centrally positioned within said inspection head.

29. The method of claim 19 wherein said compensating includes separately adjusting said inspection apparatus in each of a plurality of viewing fields associated with said printed circuit board, and which are to be inspected.

30. The method of claim 19 wherein said inspecting includes defining at least one window for locating a component feature, connecting lead or pin, illuminating said printed circuit board, monitoring reflections from said printed circuit board, and determining whether said reflections are positioned within said window; and
- wherein said adjusting includes altering said window according to the deviation detected during said comparing.

31. The method of claim 30 wherein said adjusting includes altering said window according to the curvature of said printed circuit board.

32. The method of claim 30 wherein said locating includes projecting an identifiable pattern of light onto the surface of said printed circuit board, and monitoring reflections of said identifiable pattern of light from said printed circuit board.

33. The method of claim 32 wherein said projecting includes directing light through a slide bearing said identifiable pattern.

34. The method of claim 33 wherein said identifiable pattern is a square positioned outside of a viewing field to be inspected.

35. The method of claim 34 wherein said monitoring is performed by an inspection head associated with said inspecting apparatus.

* * * * *